United States Patent
Solaro et al.

(10) Patent No.: US 10,340,266 B2
(45) Date of Patent: Jul. 2, 2019

(54) ESD PROTECTION CIRCUIT AND METHOD OF MAKING THE SAME

(71) Applicant: GLOBALFOUNDRIES Singapore Pte. Ltd., Singapore (SG)

(72) Inventors: Yohann Frederic Michel Solaro, Singapore (SG); Chai Ean Gill, Singapore (SG); Tsung-Che Tsai, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/722,744

(22) Filed: Oct. 2, 2017

(65) Prior Publication Data
US 2019/0103398 A1 Apr. 4, 2019

(51) Int. Cl.
*H01L 27/02* (2006.01)
*H01L 29/06* (2006.01)
*H01L 29/10* (2006.01)
*H01L 29/78* (2006.01)

(52) U.S. Cl.
CPC ...... *H01L 27/0266* (2013.01); *H01L 29/0619* (2013.01); *H01L 29/1095* (2013.01); *H01L 29/7816* (2013.01)

(58) Field of Classification Search
CPC ............. H01L 29/7816; H01L 29/1095; H01L 29/0619; H01L 27/0266
See application file for complete search history.

(56) References Cited

U.S. PATENT DOCUMENTS

| 6,239,463 B1 * | 5/2001 | Williams | H01L 29/165 257/328 |
| 6,441,437 B1 * | 8/2002 | Gossner | H01L 27/0248 257/355 |
| 6,683,362 B1 * | 1/2004 | O | H01L 27/0629 257/368 |

(Continued)

FOREIGN PATENT DOCUMENTS

| CN | 105609488 A | 5/2016 |
| TW | 201630148 A | 8/2016 |

OTHER PUBLICATIONS

Yoo et al., "P-Type Isolated GGNMOS with a Deep Current Path for ESD Protection", published in Proceedings of the 23rd International Symposium on Power Semiconductor Devices & IC's, May 23-26, 2011 San Diego, CA, retrieved on Jul. 17, 2017 from from "http://ieeexplore.ieee.org/document/5890870/", pp. 380-383.

(Continued)

*Primary Examiner* — Allen L Parker
*Assistant Examiner* — Charles N Ausar-El
(74) *Attorney, Agent, or Firm* — Ditthavong & Steiner, P.C.

(57) ABSTRACT

Methods of forming a high voltage ESD GGNMOS using embedded gradual PN junction in the source region and the resulting devices are provided. Embodiments include a device having a substrate including a device region with an ESD protection circuit; a gate over the device region; a source region in the device region having a N+ implant and a P+ implant laterally separated on a first side of the gate; and a drain region in the device region on a second side of the gate, opposite the first.

8 Claims, 4 Drawing Sheets

(56) References Cited

U.S. PATENT DOCUMENTS

| | | | | |
|---|---|---|---|---|
| 7,655,980 | B1* | 2/2010 | Chao | H01L 29/7833 |
| | | | | 257/335 |
| 9,614,369 | B2* | 4/2017 | Laine | H02H 9/046 |
| 9,659,922 | B2* | 5/2017 | Zhan | H01L 27/0262 |
| 9,831,232 | B2* | 11/2017 | Hong | H01L 27/0262 |
| 2003/0047750 | A1* | 3/2003 | Russ | H01L 27/0262 |
| | | | | 257/173 |
| 2005/0121725 | A1* | 6/2005 | Ando | H01L 27/0266 |
| | | | | 257/356 |
| 2005/0151160 | A1* | 7/2005 | Salcedo | H01L 27/0262 |
| | | | | 257/173 |
| 2006/0151836 | A1* | 7/2006 | Salcedo | H01L 27/0262 |
| | | | | 257/362 |
| 2008/0237704 | A1* | 10/2008 | Williams | H01L 21/761 |
| | | | | 257/338 |
| 2008/0253046 | A1* | 10/2008 | Lou | H01L 27/0262 |
| | | | | 361/56 |
| 2011/0284922 | A1* | 11/2011 | Salcedo | H01L 27/0262 |
| | | | | 257/119 |
| 2011/0303979 | A1* | 12/2011 | Hirasozu | H01L 29/0653 |
| | | | | 257/339 |
| 2013/0062691 | A1* | 3/2013 | Koo | H01L 29/7835 |
| | | | | 257/335 |
| 2013/0187218 | A1* | 7/2013 | Lai | H01L 27/027 |
| | | | | 257/328 |
| 2013/0207179 | A1* | 8/2013 | Lai | H01L 27/027 |
| | | | | 257/328 |
| 2014/0111892 | A1* | 4/2014 | Chen | H01L 27/0262 |
| | | | | 361/56 |
| 2014/0210007 | A1* | 7/2014 | Deval | H01L 29/7393 |
| | | | | 257/350 |
| 2015/0041920 | A1* | 2/2015 | Cheng | H01L 27/0266 |
| | | | | 257/401 |
| 2016/0005730 | A1* | 1/2016 | Zhan | H01L 27/0262 |
| | | | | 438/311 |
| 2017/0194788 | A1* | 7/2017 | Smith | H02H 9/046 |
| 2017/0236816 | A1* | 8/2017 | Tsai | H01L 27/0255 |
| | | | | 257/112 |
| 2018/0090481 | A1* | 3/2018 | Ryu | H01L 29/66121 |
| 2019/0057961 | A1* | 2/2019 | Solaro | H01L 27/0266 |

OTHER PUBLICATIONS

Chen et al., "Source-Side Engineering to Increase Holding Voltage of LDMOS in a 0.5-m 16-V BCD Technology to Avoid Latch-up Failure", published in 16th IEEE International Symposium on Physical and Failure Analysis of Integrated Circuits—2009, retrieved on Jul. 17, 2017, from http://ieeexplore.ieee.org/abstract/document/5232701/, 4 pages.

Office Action for the related Taiwanese Patent Application No. 106140109, dated Jul. 19, 2018, 9 pages.

* cited by examiner

ESD PROTECTION CIRCUIT AND METHOD OF MAKING THE SAME

TECHNICAL FIELD

The present disclosure relates to protection circuits in semiconductor devices. In particular, the present disclosure relates to electrostatic discharge (ESD) circuits for high voltage semiconductor devices.

BACKGROUND

Bipolar complementary metal oxide semiconductor-double diffused metal oxide semiconductor (BCD) is a technology for power integrated circuits (ICs). BCD combines different process technologies onto a single chip: bipolar for precise analog functions, CMOS for digital design, and DMOS for power and high-voltage elements. BCD addresses a broad range of products and applications in the fields of power management, analog data acquisition and power actuators. BCD technology is widely used for various applications and requires the several logic components to implement numerous power management utilities. These demands require the guarantees of ESD protection.

A p-type (P+) isolated gate-grounded N-channel metal oxide semiconductor (PI-GGNMOS) with a deep current path has been developed to improve the holding voltage ($V_h$) of a low voltage (LV) ESD protection device. The LV ESD protection device has a P+ stud implant between the source and the channel and the P+ stud implant abuts to the n-type (N+) source implant. However, this LV ESD design is not applicable to a lateral diffused (LD) transistor such as a LD metal oxide semiconductor (LDMOS) transistor which requires modulation of $V_h$ and triggering voltage ($V_{t1}$).

A need therefore exists for methodology enabling improved $V_h$ and $V_{t1}$ in LDMOS or GGNMOS transistors with ESD performance and the resulting device.

SUMMARY

An aspect of the present disclosure is to provide a high $V_h$ that fits an ESD design window. Another aspect of the present disclosure is to efficiently control/scale ($V_{t1}$) without compromising the device area with low turn-on resistance ($R_{on}$) and high failure current GO. With the addition of a P+ implant embedded in a source region and spaced away from the N+ implants in the source region, the present disclosure allows for efficient adjustment of $V_h$ and $V_{t1}$ to meet ESD design window targets without area or current density penalties. No additional masks are required and reverse protection capability (i.e., body-drain diode) is maintained. The latchup-free ESD protection circuits of the present disclosure provide high $V_h$ that fit the ESD design window. The targeted high voltage devices for the present disclosure have voltages between 20 volt (V) to 30 V and beyond.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a device including a substrate including a device region with an ESD protection circuit; a gate over the device region; a source region in the device region having a N+ implant and a P+ implant laterally separated on a first side of the gate; and a drain region in the device region on a second side of the gate, opposite the first.

Aspects of the present disclosure include an edge of the P+ implant is aligned on an edge of the gate and a length of the P+ implant comprises a length of 50 nanometer (nm) to 500 nm. Other aspects include another N+ implant, wherein an edge of each N+ implant is aligned with an opposite edge of the source region and the P+ implant is laterally separated therebetween. Another aspects includes a low-voltage p-well (LVPW) formed in the device region prior to a formation of each of the N+ and P+ implants and wherein the N+ and P+ implants and a portion of the another N+ implant are in the LVPW. Additional aspects include the separation between the P+ implant and each N+ implant is 80 nm to 100 nm. Further aspects include a length of the P+ implant between each N+ implant having a length of 400 nm to 500 nm. Other aspects include the ESD protection circuit including a LDMOS transistor, GGNMOS transistor, or BCD transistor. Yet other aspects include a grounded pad formed over the source region. Further aspects include the drain region including N+ implant.

Another aspect of the present disclosure is a method including: providing a substrate having a device region with an ESD protection circuit; forming a gate over the device region; forming a source region in the device region having a N+ implant and a P+ implant laterally separated on a first side of the gate; and forming a drain region in the device region on a second side of the gate, opposite the first.

Aspects include forming the P+ implant with an edge aligned on an edge of the gate and with a length of 50 nm to 500 nm. Other aspects include forming another N+ implant in the source region, wherein an edge of each N+ implant is aligned with an opposite edge of the source region and the P+ implant is laterally separated therebetween. Additional aspects include forming a LVPW in the device region prior to a formation of each of the N+ and P+ implants and wherein the N+ and P+ implants and a portion of the another N+ implant are formed in the LVPW. Other aspects include forming the P+ implant and each N+ implant 80 nm to 100 nm apart. Further aspects include forming the P+ implant between each N+ implant with a length of 400 nm to 500 nm. Yet other aspects include the ESD protection circuit including a LDMOS transistor, GGNMOS transistor, or BCD transistor. Other aspects include forming a grounded pad over the source region. Another aspect includes implanting the drain region with a N+ dopant.

Yet other aspects include a device having a substrate including a device region with an ESD protection circuit; a gate over the device region; a source region having an embedded N+ implant on opposite sides of the source region and a P+ implant with a length 400 nm to 500 nm in the device region under a grounded pad on a first side of the gate, wherein the P+ implant is separated from each N+ region by 80 nm to 100 nm; and a N+ drain region in the device region on a second side of the gate, opposite the first.

Aspects include the ESD protection circuit including a LDMOS transistor, GGNMOS transistor, or BCD transistor.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of inefficient modulation of $V_h$ and $V_{t1}$ in LDMOS, GGNMOS, or BCD transistors within an ESD design window. In accordance with embodiments of the present disclosure, a P+ implant is embedded in a source region and spaced away from the N+ implant in the source region. This design allows for efficient modulation of $V_h$ and $V_{t1}$ without area or current density penalties. The spacing of the P+ implant allows for the formation of a gradual junction and reduces the total P+ implant dose in the source region. The P+ implant slightly increases the base resistance compared to conventional process that have the P+ implant abutting the N+ source implant.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
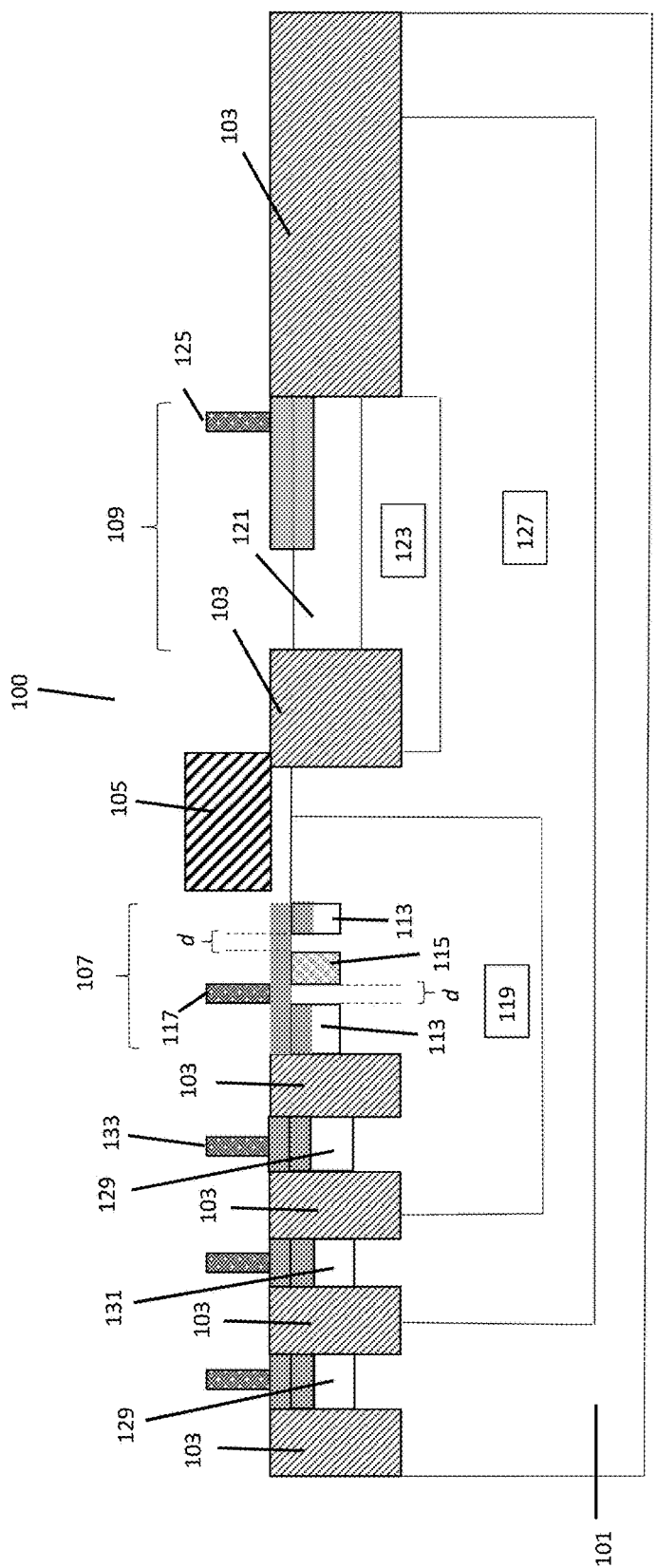
FIG. 1 schematically illustrates, in cross section, a MOS transistor with an ESD circuit, in accordance with an exemplary embodiment.

FIG. 1 schematically illustrates a MOS transistor with an ESD circuit is illustrated in cross section, in accordance with an exemplary embodiment. The device region 100 includes an ESD protection circuit. The ESD protection circuit, in one embodiment, is a LD transistor. The ESD protection circuit can be a LDMOS transistor, GGNMOS transistor, or BCD transistor. Substrate 101 is a semiconductor substrate such as a silicon substrate. In one embodiment, the substrate 101 may be a p-type doped substrate. For example, the p-type doped substrate is a lightly p-type doped substrate. Other types of semiconductor substrates, including those doped with other types of dopants or concentrations or undoped, may also be useful. The substrate 101 may be formed, e.g., of silicon germanium, germanium, gallium arsenide, or a crystal-on-insulator (COI) such as silicon-on-insulator (SOI). Shallow trench isolation (STI) regions 103 are formed in the substrate 101. The STI regions 103 extend to a depth of 4000 angstrom (A) in substrate 101.

A gate 105 is disposed on the surface of the substrate 101 in the device region. The gate 105 includes a gate electrode disposed over a gate dielectric (not shown for illustrative convenience). The gate electrode may be polysilicon. Other materials may also be useful. As for the gate dielectric, it may be silicon oxide. Other gate dielectric materials may also be useful. The gate 105 may be a gate conductor which forms gates of multiple transistors.

A first side of gate 105 includes the source region 107 and a second side of the gate 105 includes the drain region 109. Source region 107 in the device region includes N+ implants 113 and a P+ implant 115 laterally separated from the N+ implants 113. The lateral separation (d) between the P+ implant 115 and each N+ implant 113 is 80 nm to 100 nm. A length of the P+ implant 115 between each N+ implant 113 is 400 nm to 500 nm. In this embodiment, an edge of each N+ implant 113 is aligned with an opposite edge of the source region 107 and the P+ implant 115 is laterally separated therebetween. A grounded pad 117 is formed over the source region 107 and a high voltage p-well 119 is formed below it. The lateral separation of the P+ implant 115 embedded in the source region 107 and spaced away from the N+ implant 113 allows for efficient adjustment of $V_{t1}$ and $V_h$.

The drain region 109 includes an N+ implant 121 above an n-well 123 and below the electrical pad 125. A deep n-well 127 is formed below the p-well 119 and n-well 123. Additional P+ implants 129 and N+ implant 131 are formed between STI regions 103 and a grounded pad 133 is formed adjacent to the grounded pad 117. P+ dopants may include boron (B), aluminum (Al), indium (In) or a combination thereof, while N+ dopants may include phosphorus (P), arsenic (As), antimony (Sb) or a combination thereof.

Figure 2:
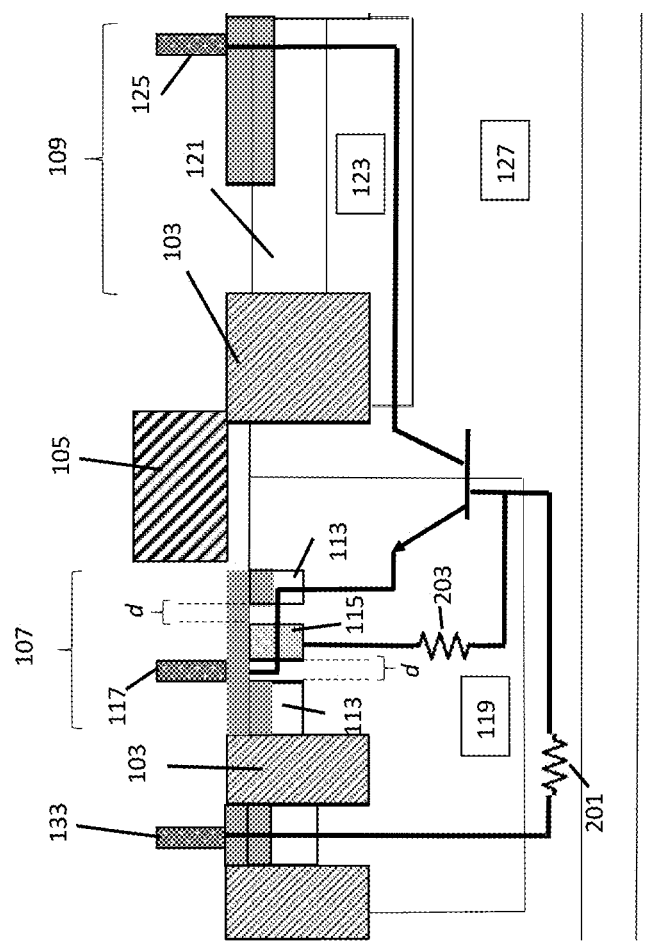
FIG. 2 schematically illustrates operational circuitry of the MOS transistor of FIG. 1, in accordance with an exemplary embodiment.

Adverting to FIG. 2, the principle underlying the operation of the MOS transistor with an ESD circuit of FIG. 1 is illustrated. First, the addition of the P+ implant 115 and lateral spacing d significantly reduces bulk resistance ($R_B$) as calculated by resistance $R_{B1}$ 201//resistance $R_{B2}$ 203. The lateral separation of the P+ implant 115 embedded in the source region 107 and spaced away from the N+ implant 113 also for a constant bulk current ($I_B$) (generated by avalanche of Drain-Body) and, therefore, a reduction of the voltage that falls between the base and emitter of a bipolar junction transistor ($V_{BE}$); a reduction of $\beta_{NPN}$; an increase of $V_{t1}$ and $V_h$; the lateral spacing d allows for control of RB, Vt1 and Vh to meet design window targets; and the spacing of the P+ implant 115 provides a more gradual doping profile and the total concentration of P+ in the source region 107 can be adjusted with lateral spacing d and controls $R_B$.

Figure 3:
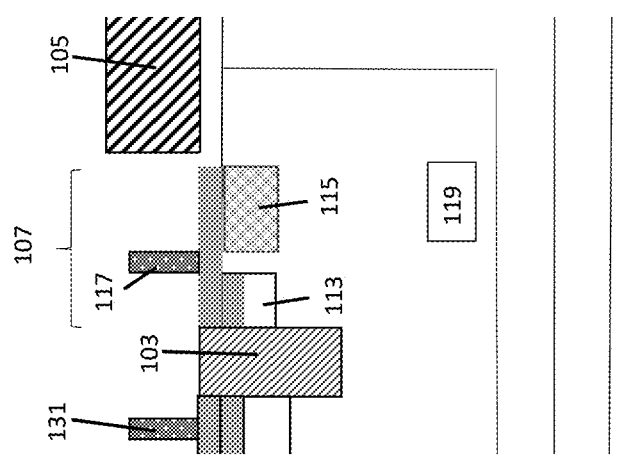
FIG. 3 schematically illustrates, in cross section, a portion of a MOS transistor with an ESD circuit, in accordance with another exemplary embodiment.

FIG. 3 schematically illustrates, in cross section, a portion of the MOS transistor with an ESD circuit of FIG. 1, in accordance with another exemplary embodiment. The MOS transistor of FIG. 3 is identical to the MOS transistor of FIG. 1, except in this instance, the P+ implant 115 is self-aligned on the edge of gate 105 and there is only one N+ implant 113 in the source region 107. In addition, whereas the P+ 115 of FIG. 1 has a length, e.g., of 400 nm to 500 nm, in this embodiment, the P+ implant 115 has a length of 50 nm to 500 nm.

Figure 4:
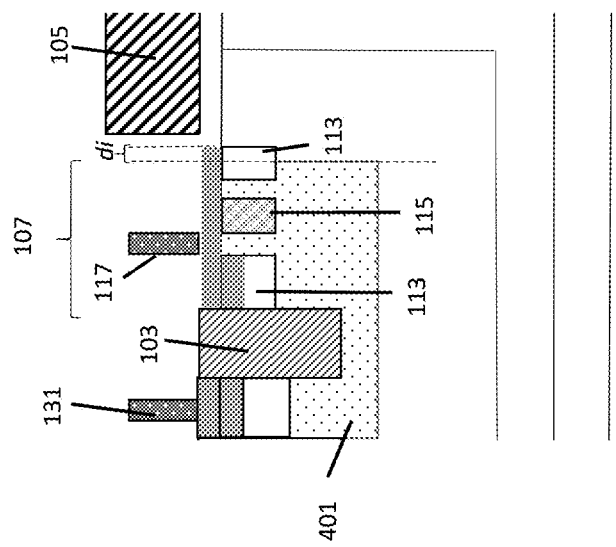
FIG. 4 schematically illustrates, in cross section, a MOS transistor with an ESD circuit, in accordance with yet another exemplary embodiment.

FIG. 3 schematically illustrates, in cross section, a portion of the MOS transistor with an ESD circuit of FIG. 1, in accordance with another exemplary embodiment. The MOS transistor of FIG. 4 is identical to the MOS transistor of FIG. 1, except in this instance, a LVPW 401 formed in the device region prior to a formation of the N+ implants 113 and P+ implant 115. Consequently, an N+ implant 113, the P+ implant 115 and a portion of the other N+ implant 113 are formed in the LVPW 401. Similar to FIGS. 1 and 3, the separation between the P+ implant 115 and an N+ implant 113 is 80 nm to 100 nm. In this instance, the lateral separation di represents a distance of 50 nm to 500 between the edge of the LVPW 401 and the edge of the N+ implant not within the LVPW 401

The embodiments of the present disclosure can achieve several technical effects, including efficient control of $V_{t1}$ and $V_h$ to meet ESD targets (design window) by manipulation of the lateral separation d parameter without requiring additional masks. Other technical effects include maintenance of a reverse protection capability (body-drain diode) and current density/area (no area penalty) as well achieving tight dispersion (stable with process). The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, digital cameras, power conversion applications, power management, analog data acquisition and power actuators. The present disclosure therefore enjoys industrial applicability in any of various types of high voltage semiconductor devices including ESD circuits.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a substrate including a device region with an electrostatic discharge (ESD) protection circuit;
   a gate over the device region;
   a source region in the device region having a n-type (N+) implant and a p-type (P+) implant laterally separated on a first side of the gate;
   a drain region in the device region on a second side of the gate, opposite the first;
   another N+ implant, wherein an edge of each N+ implant is aligned with an opposite edge of the source region and the P+ implant is laterally separated therebetween; and
   a low-voltage p-well (LVPW) formed in the device region prior to a formation of each of the N+ and P+ implants and wherein the N+ and P+ implants and a portion of the another N+ implant are in the LVPW.

2. The device according to claim 1, wherein an edge of the P+ implant is aligned on an edge of the gate.

3. The device according to claim 1, wherein the separation between the P+ implant and each N+ implant comprises 80 nm to 100 nm.

4. The device according to claim 1, wherein the ESD protection circuit comprises a lateral diffusion metal oxide semiconductor (LDMOS) transistor, gate grounded N-channel metal oxide semiconductor (GGNMOS) transistor, or BCD transistor.

5. The device according to claim 1, further comprising a grounded pad formed over the source region.

6. The device according to claim 1, wherein the drain region comprises N+ implant.

7. A device comprising:
   a substrate including a device region with an electrostatic discharge (ESD) protection circuit;
   a gate over the device region;
   a source region having an embedded n-type (N+) implant on opposite sides of the source region and a p-type (P+) implant in the device region under a grounded pad on a first side of the gate, wherein the P+ implant is separated from each N+ region by 80 nm to 100 nm;
   a N+ drain region in the device region on a second side of the gate, opposite the first
   another N+ implant, wherein an edge of each N+ implant is aligned with an opposite edge of the source region and the P+ implant is laterally separated therebetween; and
   a low-voltage p-well (LVPW) formed in the device region prior to a formation of each of the N+ and P+ implants and wherein the N+ and P+ implants and a portion of the another N+ implant are in the LVPW.

8. The device according to claim 7, wherein the ESD protection circuit comprises a lateral diffusion metal oxide semiconductor (LDMOS) transistor, gate grounded N-channel metal oxide semiconductor (GGNMOS) transistor, or BCD transistor.

* * * * *